(12) United States Patent
Ishikawa et al.

(10) Patent No.: US 9,982,364 B2
(45) Date of Patent: May 29, 2018

(54) PROCESS GAS PREHEATING SYSTEMS AND METHODS FOR DOUBLE-SIDED MULTI-SUBSTRATE BATCH PROCESSING

(71) Applicant: APPLIED MATERIALS, INC., Santa Clara, CA (US)

(72) Inventors: David Masayuki Ishikawa, Mountain View, CA (US); Paul J. Steffas, Santa Clara, CA (US); Sumedh Acharya, Bangalore (IN); Brian H. Burrows, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 78 days.

(21) Appl. No.: 15/092,875

(22) Filed: Apr. 7, 2016

(65) Prior Publication Data

US 2016/0298263 A1 Oct. 13, 2016

Related U.S. Application Data

(60) Provisional application No. 62/144,272, filed on Apr. 7, 2015.

(51) Int. Cl.
*C30B 25/10* (2006.01)
*C30B 25/22* (2006.01)
(Continued)

(52) U.S. Cl.
CPC .......... *C30B 25/22* (2013.01); *C23C 16/4557* (2013.01); *C23C 16/45502* (2013.01);
(Continued)

(58) Field of Classification Search
CPC ......... C30B 23/02; C30B 25/02; C30B 25/08; C30B 25/10; C30B 25/12
See application file for complete search history.

(56) References Cited

U.S. PATENT DOCUMENTS 5,683,518 A * 11/1997 Moore ................ C23C 16/4404
118/50.1
6,262,393 B1 * 7/2001 Imai ...................... C23C 16/458
118/50.1
(Continued)

FOREIGN PATENT DOCUMENTS

JP 2013-159545 A 8/2013

OTHER PUBLICATIONS

International Search Report and Written Opinion dated Jul. 19, 2016 for PCT Application No. PCT/US2016/026422.

*Primary Examiner* — Robert M Kunemund
(74) *Attorney, Agent, or Firm* — Moser Taboada; Alan Taboada

(57) ABSTRACT

In some embodiments, an substrate processing system may include a chamber body, a heater assembly disposed within the chamber body, wherein the heater assembly includes a plurality of resistive heater elements coupled together to form an isothermal heated enclosure, and a process kit disposed within the isothermal heated enclosure and having an inner processing volume that includes a plurality of substrate supports to support substrates when disposed thereon, wherein the process kit includes a first processing gas inlet to provide processing gases to the inner processing volume, a first carrier gas inlet to provide a carrier gas to the inner processing volume, and a first exhaust outlet, and a first gas heater coupled via a first conduit to the first carrier gas inlet to heat the carrier gas prior to flowing into the inner processing volume.

15 Claims, 14 Drawing Sheets

(51) Int. Cl.
   *H01L 31/18*   (2006.01)
   *H01L 21/67*   (2006.01)
   *H01L 21/687*  (2006.01)
   *C30B 25/12*   (2006.01)
   *C30B 25/14*   (2006.01)
   *C30B 29/06*   (2006.01)
   *C23C 16/455*  (2006.01)
   *C23C 16/46*   (2006.01)
   *H01L 21/02*   (2006.01)

(52) U.S. Cl.
   CPC ........ *C23C 16/45512* (2013.01); *C23C 16/46* (2013.01); *C30B 25/10* (2013.01); *C30B 25/12* (2013.01); *C30B 25/14* (2013.01); *C30B 29/06* (2013.01); *H01L 21/6719* (2013.01); *H01L 21/67103* (2013.01); *H01L 21/67109* (2013.01); *H01L 21/68771* (2013.01); *H01L 31/1804* (2013.01); *H01L 31/1876* (2013.01); *H01L 21/0262* (2013.01); *H01L 21/02532* (2013.01)

(56) References Cited

U.S. PATENT DOCUMENTS

| | | |
|---|---|---|
| 6,399,510 B1 | 6/2002 | Riley et al. |
| 8,673,081 B2 | 3/2014 | Sivaramakrishnan et al. |
| 9,255,346 B2 | 2/2016 | Sivaramakrishnan et al. |
| 2001/0046768 A1 | 11/2001 | Mezey, Sr. |
| 2003/0124820 A1 | 7/2003 | Johnsgard et al. |
| 2005/0085057 A1 | 4/2005 | Hashikura et al. |
| 2013/0330930 A1 | 12/2013 | Saido et al. |

\* cited by examiner

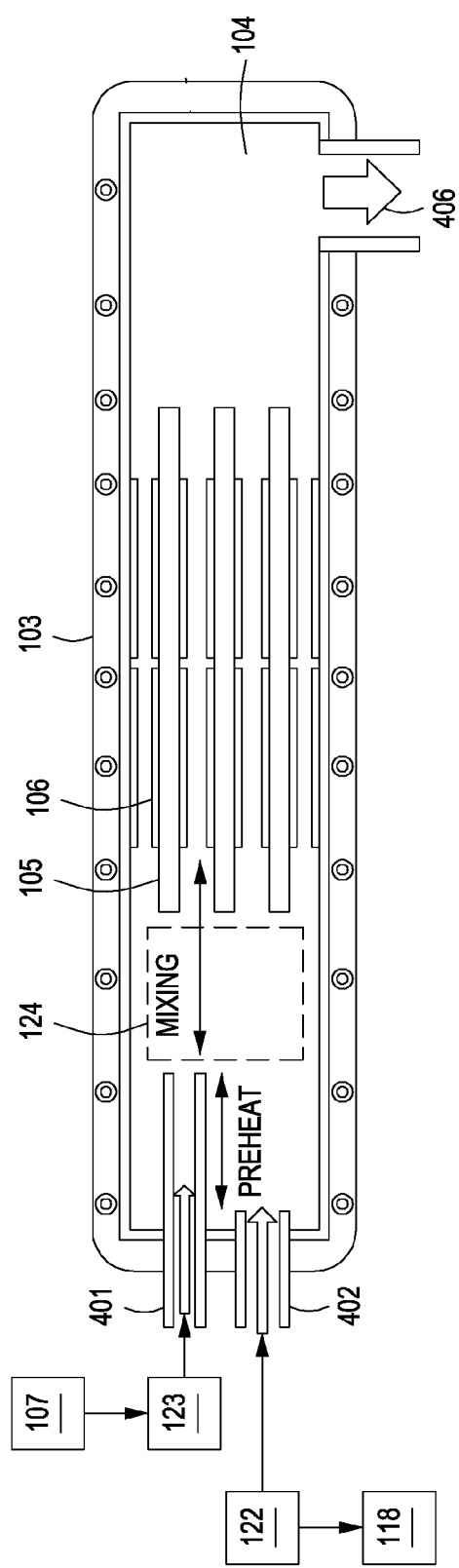

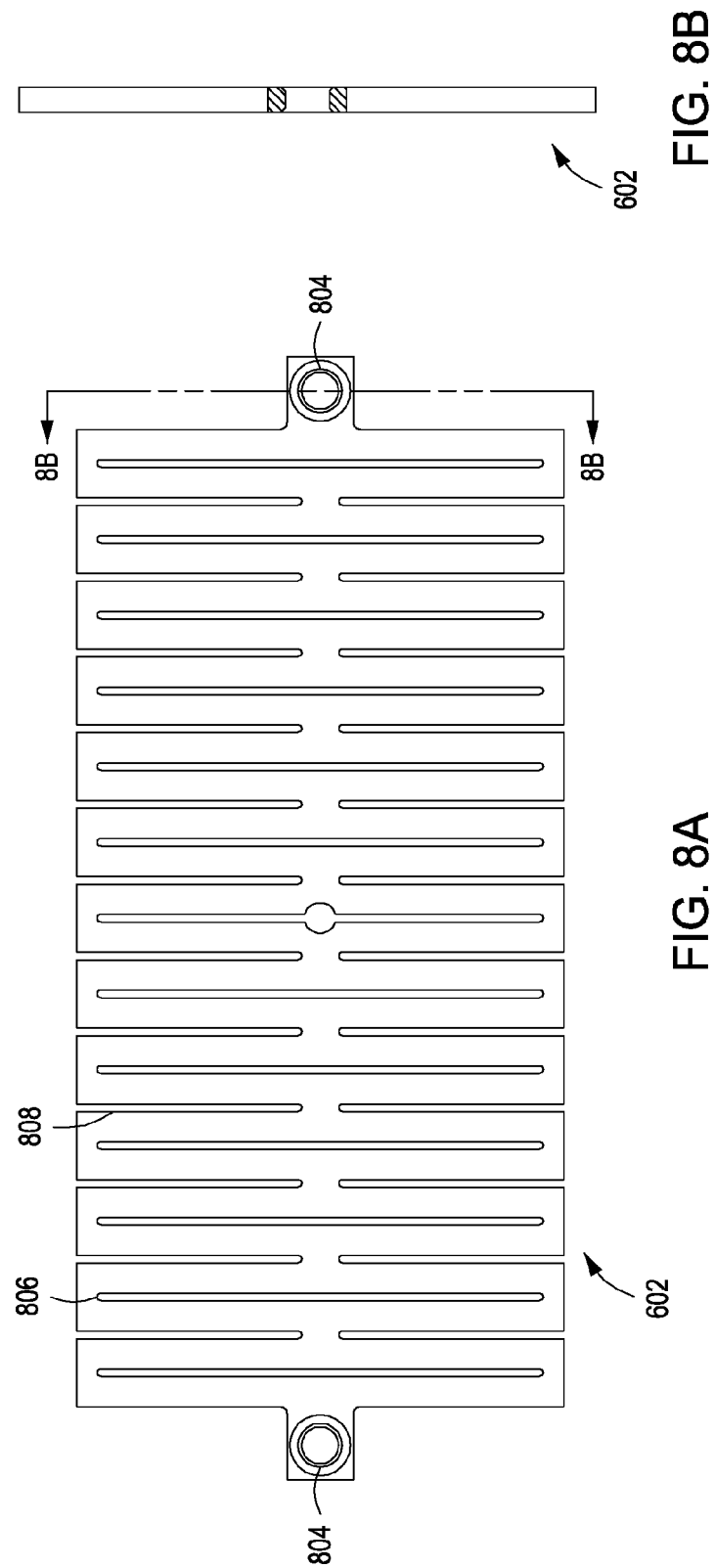

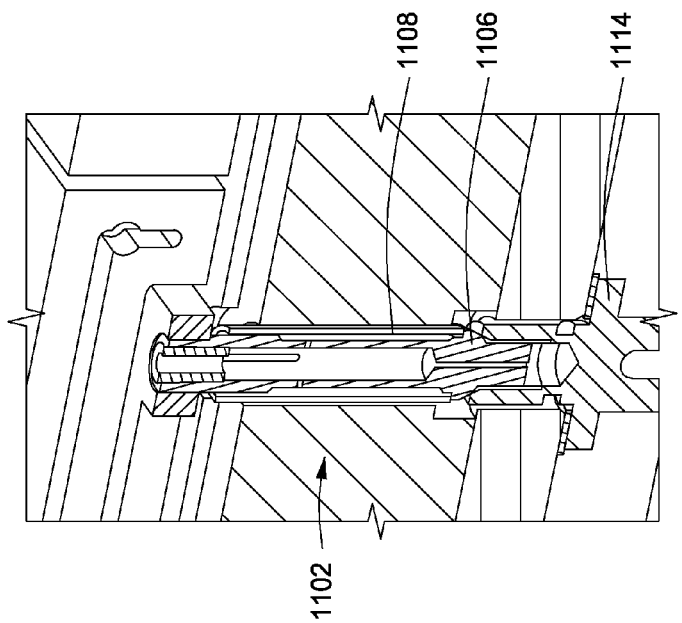
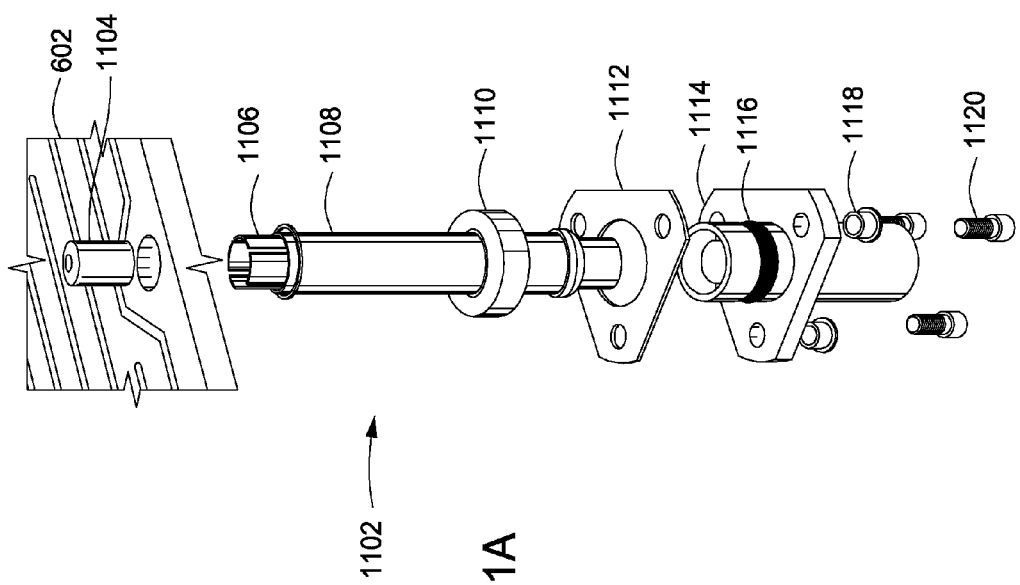
FIG. 11A
FIG. 11B

PROCESS GAS PREHEATING SYSTEMS AND METHODS FOR DOUBLE-SIDED MULTI-SUBSTRATE BATCH PROCESSING

CROSS-REFERENCE TO RELATED APPLICATIONS

This application claims benefit of U.S. provisional patent application Ser. No. 62/144,272, filed Apr. 7, 2015, which is herein incorporated by reference.

FIELD

Embodiments of the present disclosure generally relate to semiconductor processing equipment.

BACKGROUND

Silicon solar cells are manufactured using amorphous and polycrystalline solar-grade substrates. Epitaxial silicon substrates have fewer crystal defects than amorphous and polycrystalline substrates and therefore can be used to manufacture higher efficiency solar cells; however, epitaxial silicon substrates are expensive to produce using conventional epitaxial deposition equipment. Conventional epitaxial deposition equipment used to manufacture prime-grade silicon substrates for integrated devices have high operating costs and are not suitable for solar-grade substrate manufacturing where the cost per substrate is paramount.

Commercially viable kerf-less crystalline silicon substrate manufacturing for solar cell production requires low equipment capital expense, high energy efficiency, and high process gas utilization. Conventional lamp-heated crossflow epitaxial deposition equipment designs do not comply with capital expense, energy efficiency, and process gas utilization requirements for kerf-less crystalline silicon solar substrate manufacturing. For example, the inventors have observed that single substrate systems are: throughput-limited; less than twenty-percent energy efficient; optimized for low gas efficiency to produce thin (less than one micron thick) films; and unsuitable for depositing thick films which produce unwanted parasitic deposits and require frequent maintenance.

Several attempts have been made to develop and commercialize epitaxial deposition equipment for solar substrate manufacturing. The major deficiencies with these multi-substrate batch and continuous in-line equipment architectures are low energy efficiency and low process gas utilization. These architectural deficiencies are due to the sub-optimal method for substrate heating (i.e. radiative versus conductive or convective heating) and the larger than necessary size of the processing volume.

Conventional epitaxial deposition systems mechanically support and conductively heat one or more substrates using silicon carbide coated graphite or solid silicon carbide susceptors. The susceptor thermal mass is optimized to interact with the substrate and the heat source in order to produce a tunable thermal gradient across the substrate surface. The inventors believe that heating the susceptor using infrared radiation lamps is an energy inefficient approach for heating the susceptor and substrate. Furthermore, the inventors believe that resistively heating the substrates by applying AC or DC electricity to the susceptor to induce Joule heating is a meritless capital intensive approach that would not satisfy low cost of ownership requirements. Direct heating requires an inordinate number of complex electromechanical components, costly power supplies, and one susceptor per substrate; furthermore, direct heating requires one face of the substrate to be in contact with the susceptor which precludes double-sided processing.

Therefore, the inventors have provided embodiments of a substrate processing tool that may provide some or all of high energy efficiency, high precursor utilization, low cost of equipment, and high throughput and process quality.

SUMMARY

In some embodiments, a substrate processing system may include a chamber body, a heater assembly disposed within the chamber body, wherein the heater assembly includes a plurality of resistive heater elements coupled together to form a heated enclosure, a process kit disposed within the heated enclosure and having an inner processing volume that includes a plurality of substrate supports to support substrates when disposed thereon, wherein the process kit includes a first processing gas inlet to provide processing gases to the inner processing volume, a first carrier gas inlet to provide a carrier gas to the inner processing volume, and a first exhaust outlet, and a first gas heater coupled via a first conduit to the first carrier gas inlet to heat the carrier gas prior to entering the inner processing volume.

In some embodiments, a heater assembly may include a plurality of resistive heater elements coupled together to form a heated enclosure, wherein each of the resistive heater elements includes a base formed of graphite, wherein the base is configured as a plurality of serial or parallel pickets through which electricity flows to resistively heat the element, and wherein a silicon carbide (SiC) coating disposed on the surfaces of the graphite base protects the graphite from oxidation and chemical degradation, wherein the thickness of the silicon coating is about 50 microns to about 100 microns and a plurality of electrical feedthrough heater posts are coupled to the base to provide electricity to the resistive heater elements.

In some embodiments, a method for performing double-sided epitaxial deposition includes disposing a plurality of substrates onto a corresponding plurality of substrate supports disposed in an inner processing volume of an enclosed process kit, heating the process kit via an external heater assembly, preheating a carrier gas prior to flowing into the inner processing volume via a first gas heater, mixing the preheated carrier gas and processing gases in a first mixing plenum disposed within the inner processing volume, and flowing the mixed preheated carrier gas and the processing gases in a first direction over both processing surfaces of each of the plurality of substrates to enable double-sided epitaxial deposition on the plurality of substrates.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

FIGS. 4A and 4B depict exemplary embodiments of isothermally heating process kits and point of use process gas mixing, in accordance with the present disclosure.

FIGS. 8A and 8B depict top and side views, respectively, of an exemplary embodiment of a resistive heater element, in accordance with the present disclosure.

FIGS. 11A-11B depict embodiments of a heater post, in accordance with the present disclosure.

Figure 1:
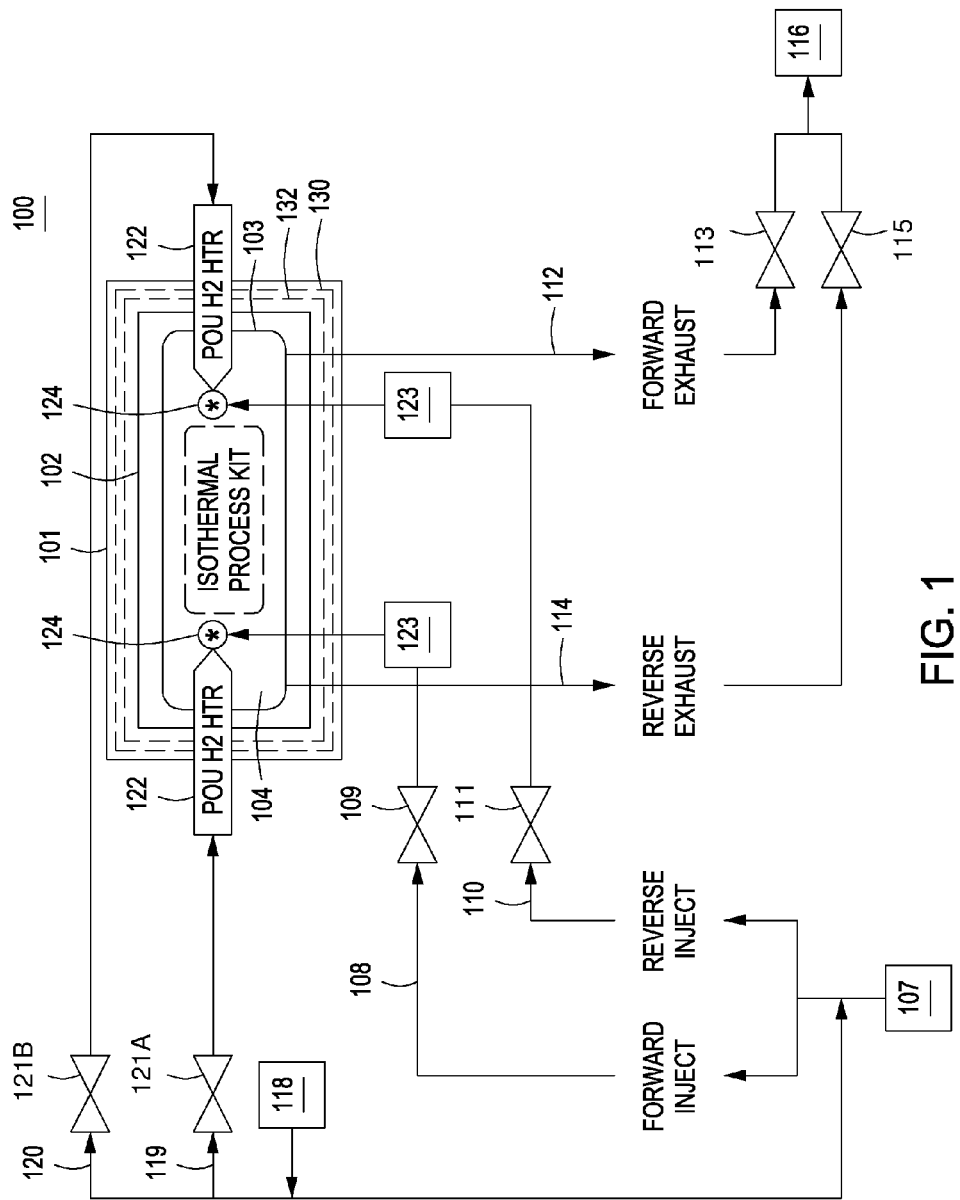
FIG. 1 depicts a substrate processing system, in accordance with the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of an improved multi-substrate batch substrate processing tool are provided herein. The inventive multi-substrate batch substrate processing tool advantageously provides an energy and cost efficient usage, as compared to conventional substrate processing tools utilized to perform multi-step substrate processes. While not limiting in scope, the inventors believe that the inventive multi-substrate batch substrate processing tool may be advantageous for processing single-sided substrates and for different types of semiconductor substrates, for example such as 300 mm and larger semiconductor substrates, photovoltaic substrates, display substrates, or the like.

In some embodiments consistent with the present disclosure, the double-sided batch substrate system described herein advantageously improves epitaxial reactor throughput at reduced capex per substrate by providing a plurality of identical reaction cavities that facilitate simultaneous processing a high density of substrates within a small reaction volume to improve gas utilization, optimize power use, and minimize unwanted parasitic deposition.

Furthermore, there are additional advantages of performing double-sided substrate processing. Specifically, two useable substrates on each substrate are formed out of each process cycle and substantial overhead in the epitaxial deposition process can be saved by processing both sides of the substrate simultaneously.

FIG. 1 depicts a substrate processing system 100 that includes gas preheating and point of use mixing in a multi-substrate batch substrate processing tool in accordance with some embodiments of the present disclosure. The substrate processing system 100 is a multi-substrate batch system that is able to process a plurality of substrates in one process cycle.

The substrate processing system 100 includes a chamber body 101. The chamber body 101 may be a stainless steel enclosure. In some embodiments, the chamber body 101 may be water cooled. In some embodiments, the inner walls of the chamber body 101 may include a quartz liner 130 to provide insulation and reduce radiation and convective losses from the process kit 103. The chamber body 101 houses a process kit 103 (also referred to herein as an isothermal vessel), which includes an inner processing volume 104 for processing substrates. In some embodiments, the process kit 103 may be formed from an assembly of silicon carbide coated graphite parts. In some embodiments, the process kit is a closed process kit that may have minimal openings to prevent processing gases from leaking out of the process kit 103.

Figure 2:
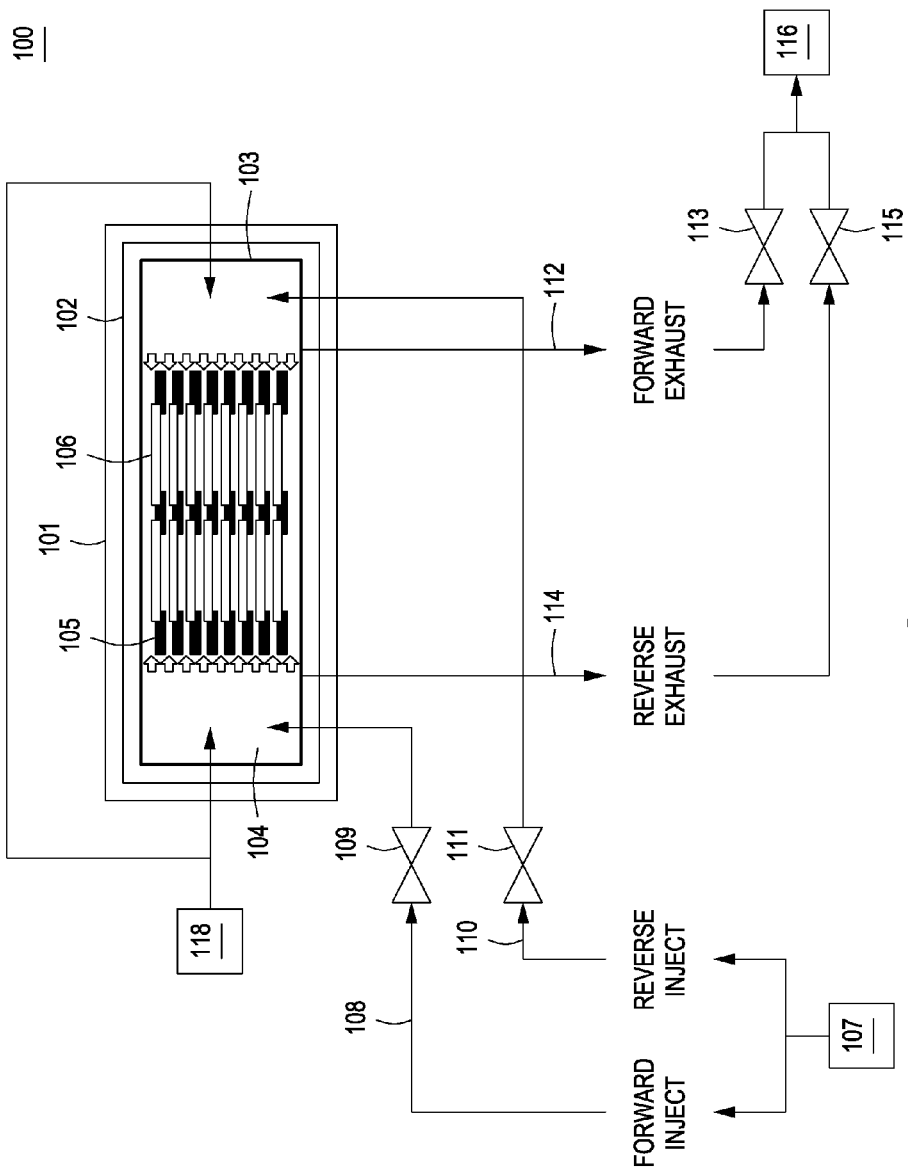
FIG. 2 depicts further details of a substrate processing system, in accordance with the present disclosure.

As shown in FIG. 2, the process kit 103 may include a plurality of parallel susceptors 105 for supporting a plurality of substrates 106. Process gases that enter the inner processing volume 104 may evenly flow between susceptors 105 in either a forward or reverse direction as shown in FIG. 2. The space between the parallel susceptors may be about 5 mm to about 50 mm. Although FIG. 2 depicts double-sided substrate processing, substrate processing system 100 can perform both single-sided and double-sided deposition on the substrates. In some existing substrate processing systems, process gas (i.e., trichlorosilane (TCS)) utilization may only be about one to ten percent, with more than ninety percent of the process gas being exhausted out of the processing volume. However, alternating flow advantageously results in thirty percent or higher process gas utilization which produces significant cost savings. As the pitch between the parallel susceptors is decreased, the process gas velocity over the substrates and silicon deposition rate increases which improves process gas utilization.

The parallel susceptors 105 depicted in FIG. 2 enable double-sided substrate processing by supporting the substrates along their peripheral edges and exposing both sides of the substrate equally to the processing chemistry. Those skilled in the art understand that with double-sided substrate processing methods and tools, substrate handling throughout the process needs to protect both faces of the substrate. Traditionally, a vacuum may be used with single-sided processing on a backside of the substrate to transfer from one process step or processing module/tool to the next process step or processing module/tool. However, with double-sided substrate processing, other types of substrate handling methods and devices may be used. In some embodiments, specific edge handling techniques may be used that utilize an exclusion zone along the edges of the substrate. Other types of handling may include using a Bernoulli grip/vacuum handler or using an oversized substrate where the edge exclusion is larger. Still, other types of non-limiting substrate handling methods and systems for double-sided substrate processing may include edge contact methods, or some non-contact methods.

The chamber body 101 may also house a heater assembly 102 that surrounds the process kit 103 to provide temperature control to the process kit 103. The heater assembly 102 may be a resistive heater assembly, a lamp assembly, an inductive heater assembly, or other type of heating device to provide multi-zone heat to the process kit 103. Exemplary embodiments of the heater assembly 102 are described below in more detail with respect to FIGS. 6 through 12. The quartz liner 130 is used to provide insulation and reduce thermal losses from the heater to the water cooled chamber body 101. In addition, in some embodiments, one or more silicon carbide coated graphite plates/elements 132 may be disposed between the quartz liner 130 and the heater assembly 102 to further act as a radiation shield and reduce the quartz liner 130 surface temperature to less than 1000 degrees Celsius during processing. Lower quartz temperatures are beneficial in minimizing oxygen liberation the chamber body 101.

The substrate processing system 100 includes a processing gas source 107 which can inject processing gases into the inner processing volume 104 for unidirectional or alternating flow processes. In some embodiments, process gas supplied by gas source 107 may be, for example, trichlorosilane (TCS). Although TCS is used in the present disclosure, those skilled in the art would understand that other silicon precursor gases may be used. For example, disilane (Si2H6) and dichlorosilane (DCS) may also be used. In some embodiments, TCS gas may be supplied at a rate of about one to ten SLM (standard liter per minute) or higher per substrate. The silicon precursor gas can be produced by bubbling hydrogen in an ampoule containing liquid disilane or by flowing liquid disilane into a vaporizer. Bubblers, vaporizers, and other commercially available liquid delivery equipment are used in the semiconductor industry to provide a variety of gaseous chemicals at precise concentrations for semiconductor processing. In some embodiments, a process gas composed of twenty to forty percent TCS with the rest being carrier gas is introduced into inner processing volume 104. In some exemplary embodiments, the carrier gas may be hydrogen (H2), although those skilled in the art would understand that other carrier gases may be used. In some embodiments, TCS may be may be mixed with dopant gases such as diborane (B2H6) or arsine (AsH3) to control the resistivity of the deposited film. TCS gas may be mixed with a carrier gas provided by a carrier gas source 118 prior to entering the inner processing volume 104. For both unidirectional and alternating flow processing, process gases may be injected into the inner processing volume 104 via conduit 108 and valve 109 for forward process gas flow. Forward flow process gases may be exhausted via conduit 112 and valve 113 to abatement system 116. In addition, for reverse flow substrate processing (i.e., opposite flow of gases over the substrates), processing gases may be injected into the inner processing volume 104 via conduit 110 and valve 111 for reverse process gas flow. Reverse flow processing gases may be exhausted via conduit 114 and valve 115 to abatement system 116. Alternating flow processing can be accomplished by alternating between forward flow and reverse flow as many times as needed to produce uniformly thick films on the substrates.

In addition, supplemental carrier gas from carrier gas source 118 may be separately flowed into the inner processing volume 104 via valve 121A or valve 121B. In some embodiments, the carrier gas may be supplied at a rate of about ten SLM per substrate to about fifty SLM per substrate. In some embodiments, the carrier gas may be supplied at a rate of about fifteen SLM per substrate. For both unidirectional and alternating flow substrate processing, carrier gases may be injected into the inner processing volume 104 via conduit 119 and valve 121A for forward process gas flow. In addition, for alternating flow substrate processing, carrier gases may also enter the inner processing volume 104 via conduit 120 and valve 121B for reverse process gas flow (i.e., alternate/opposite flow of gases over the substrates). Forward flow carrier gases may be exhausted via conduit 112 and valve 113 to abatement system 116. Reverse flow carrier gases may be exhausted via conduit 114 and valve 115 to abatement system 116.

In some embodiments, pressure controlled purge gas circulates outside of the process kit 103. The purge flow rates can be adjusted outside of the process kit 103 to produce slight positive pressure outside the process kit 103 relative to the inside pressure in order to minimize process gas leakage out of the process kit 103. The differential pressure between the inner processing volume 104 and the volume outside of the process kit 103 can be controlled using a differential pressure gage that monitors pressures internal and external to the process kit and by increasing the purge gas flow until the desire pressure differential is achieved. By controlling the differential pressure as described, deposition outside of the process kit 103 can be minimized or eliminated, and unwanted process gas dilution due to excessive purge gas flow into the process kit 103 can be avoided. In other embodiments, a separate purge gas other than the carrier gas may be used as a purge gas curtain around the isothermal process kit 103.

In conventional epitaxial deposition systems, surfaces near the leading edge of the substrates (i.e., the edge closest to the process gas inlet into the processing chamber) exhibit deposition rates around tens of microns per minute. The deposition rate exponentially decreases as silicon precursors are depleted from the processing gas. Therefore a high to low gradation in the deposition rate along the flow path over the substrate results in unwanted substrate thickness non-uniformity characterized by the leading edge substantially thicker than the downstream trailing edge. Thus, to improve deposition uniformity across the entire substrate, the flow of the processing gases may be alternated one or more times during the deposition process at various time intervals as required to, in combination with precursor concentration and temperature adjustments in the deposition process recipe, produce a uniformly thick film.

The inventors have observed that high deposition rate requires high process gas velocity. The major issue with epitaxial deposition at atmospheric pressure and high velocity is that unheated process gas will convectively cool the surface of the substrate below 1100 degrees Celsius, the minimum temperature for epitaxial silicon deposition. It is difficult to control the inlet gas temperature of the processing gases in conventional substrate processing systems; conventional systems utilize infrared lamp heated silicon carbide coated graphite preheat rings and baffles that convectively heat low flow processing gas from an initial inlet temperature of twenty degrees Celsius to four hundred degrees Celsius or higher up to about 1100 degrees Celsius. These gas preheat surfaces have are sufficient for low gas flows used in single substrate processing but are insufficient for continuously heating processing gases at high flow rates. The result from this gas cooling effect is that the leading edges of the substrates will be colder than the opposing edges, large thermal gradients across the substrates are observed, and it is difficult to control substrate-to-substrate temperature. The inventive substrate processing system 100 includes one or more devices and ways to preheat the process gas upstream of the process plenum (i.e., the inner processing volume 104) and employs point of use (POU) mixing of deposition precursors (i.e., processing gases from gas source 107) and preheated carrier gas (i.e., carrier gases from carrier gas source 118).

Specifically, as shown in FIG. 1, substrate processing system 100 includes one or more gas heaters 122 to preheat the carrier gas from carrier gas source 118 prior to entering the inner processing volume 104. In addition, in some embodiments, the substrate processing system 100 may include one or more gas heaters 123 to preheat the TCS from process gas source 107 prior to entering the inner processing volume 104. Although shown in FIG. 1 as separate gas heaters 122, a single gas heater 122 can be used for heating both the forward and reverse flow carrier gases. Similarly, a single gas heater 123 can be used for heating both the forward and reverse flow TCS process gases. The gas heaters 122 and 123 may be the same heater design.

The carrier gas may be heated by gas heater 122 to near deposition temperature. In some embodiments, the carrier gas may be heated by gas heater 122 to greater than 1100 degrees Celsius. In some embodiments, the carrier gas may be heated by gas heater 122 to about 900 to 1250 degrees Celsius. Processing gases may be introduced into the mixing plenum 124 within the inner processing volume 104 cold or at room temperature. The preheated carrier gas mixes with the processing gases in mixing plenum 124 within the inner processing volume 104 of the process kit 103 to heat the processing gases before the gas reaches the leading edges of the substrates 106. The inventors have advantageously found that preheating processing gases to deposition temperature prior to entering the process plenum provides for the best thermal uniformity and control inside a high density multi-substrate batch reactor. Thus, in some embodiments, the processing gases may also be preheated via gas heaters 123 prior to entering the mixing plenum 124 within the inner processing volume 104. However, since TCS starts to react at 600 degrees Celsius, the processing gas is heated to a temperature less than 600 degrees Celsius. As noted above, the carrier gas can be preheated separately from the TCS and other process gases to avoid pre-reaction inside the heater at temperatures greater than 600 degrees Celsius. By preheating the carrier and processing gases prior to entering the inner processing volume of the reactor, the length of the process kit 103 can be advantageously minimized. The minimized length advantageously minimizes parasitic deposition by obsoleting the need for conventional preheating baffles and substantially reducing the total internal surface area within the process kit 103 between the mixing plenum 124 and leading edge of substrates.

In some typical substrate processing systems, one side of the substrate is in direct contact with a heater, so simultaneous double-sided processing is not possible. However, preheating and mixing of the gases as described above, in addition to the use of the external heating provided by the multi-zone resistive heater assembly 102, advantageously enables double-sided processing (i.e., allows for both sides of the substrate to be processed simultaneously) by controlling the substrate temperature. That is, external heating provided by multi-zone resistive heater assembly 102, along with preheated processing gases, enable double-sided epitaxial deposition. In some embodiments, the double-sided processing of substrates that is enabled by preheating and mixing of the gases may include, but is not limited to, pre-heated hydrogen annealing of both sides of the substrates, as well as epitaxial layer growth/thickening on both sides of the substrates.

Figure 3:
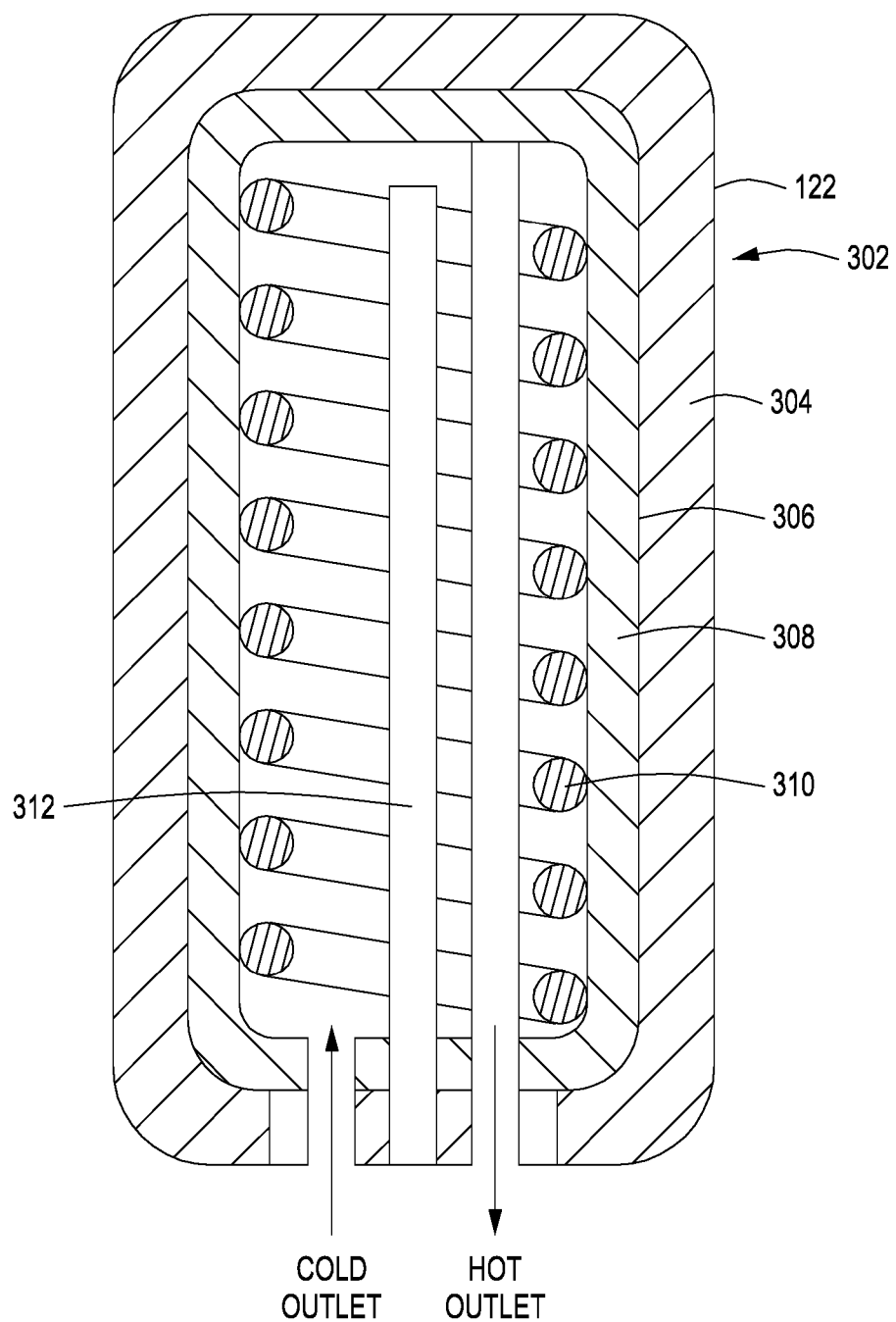
FIG. 3 depicts a gas heater, in accordance with the present disclosure.

FIG. 3 depicts an exemplary embodiment of a gas heater 122. In some embodiments, the gas heater 122 includes a stainless steel shield 302 which may be water-cooled. The stainless steel shield 302 may be insulated with argon and/or a glass wool liner 304. A quartz tube liner 306 may provide further insulation. A graphite sleeve 308 is disposed within the quartz tube liner 306. The graphite sleeve 308 includes a spiral passage 310 through which the gas flows. A spiral passage 310 is disposed about a central graphite heater 312 which heats the gas flowing through the spiral passage.

Figure 4A:
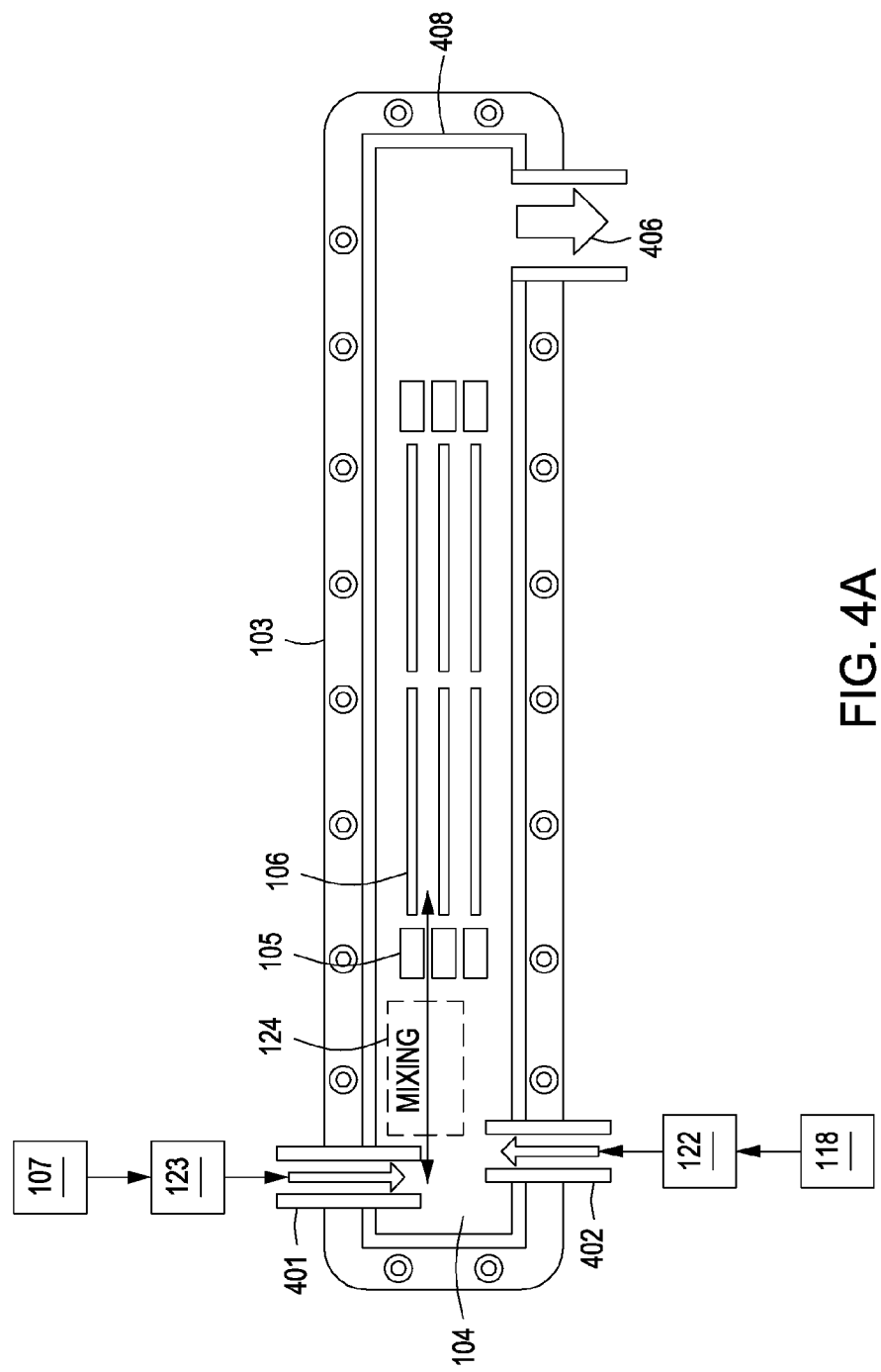

FIGS. 4A and 4B depict exemplary embodiments of isothermal processing process kits for use with the substrate processing system in accordance with the present disclosure. Specifically, FIG. 4A depicts an isothermal processing process kit 103 including a double-sided multi-substrate batch processing configuration. In FIG. 4A, preheated carrier gas from carrier gas source 118 and gas heater 122 enters the inner processing volume 104 of the isothermal processing process kit 103 via inlet 402. Deposition processing gases from process gas source 107 enters the inner processing volume 104 of the isothermal processing process kit 103 via inlet 401. The deposition processing gases may also be preheated via heater 123 before entering the inner volume 124. The preheated carrier gas and processing gases mix in mixing plenum 124. In some embodiments, mixing plenum 124 may include one or more baffles or other structure, such as a static swirl mixer, to promote mixing. In some embodiments, the leading edge of the susceptor 105 may be heated to promote heating of the process gases before contacting the leading edge of the substrate 106. Depleted exhaust gases exit via exhaust outlet 406. Although inlets 401, 402 and outlet 406 are shown for forward flow processing for clarity, the isothermal processing process kit 103 may also include inlets and an outlet in a mirror configuration for reverse/alternate flow processing as well.

FIG. 4B depicts an isothermal processing process kit 103 including a single-sided multi-substrate batch processing configuration. In FIG. 4B, preheated carrier gas from carrier gas source 118 and gas heater 122 enters the inner processing volume 104 of the isothermal processing process kit 103 via inlet 402. Processing gases from process gas source 107 enters the inner processing volume 104 of the process kit 103 via inlet 401. The deposition processing gases may also be preheated via heater 123 before entering the inner volume 124. The preheated carrier gas and processing gases mix in mixing plenum 124. In some embodiments, mixing plenum 124 may include one or more baffles or other structure, such as a static swirl mixer, to help promote mixing. In some embodiments, the inlets 401 and 402 and the leading edge of the susceptor 105 may be heated to promote heating of the processing gases before contacting the leading edge of the substrate 106. The leading edge of the susceptors 105 may be considered adjustable length preheat baffles, the length of which can be adjusted to compensate for thermal non-uniformities inside the stack of substrates. Depleted exhaust gases exit via exhaust outlet 406. Although inlets 401, 402 and outlet 406 are shown for forward flow processing for clarity, the process kit 103 may also include inlets and an outlet in a mirror configuration for alternating flow substrate processing as well.

In FIGS. 4A and 4B, the inlets 401, 402 may be an actuating gas inlet conduit that couples to the process kit 103. The inlets 401, 402 may be constructed from high purity fused quartz tube, solid silicon carbide tube, or silicon carbide coated graphite tube that actuates into the deposition plenum (i.e., inner processing volume 104) and contains a floating collar that allows gas sealing of the inner processing volume 104. The exhaust outlet 406 may also include a floating collar or one way seal that allows gas sealing of the inner processing volume 104.

Figure 5:
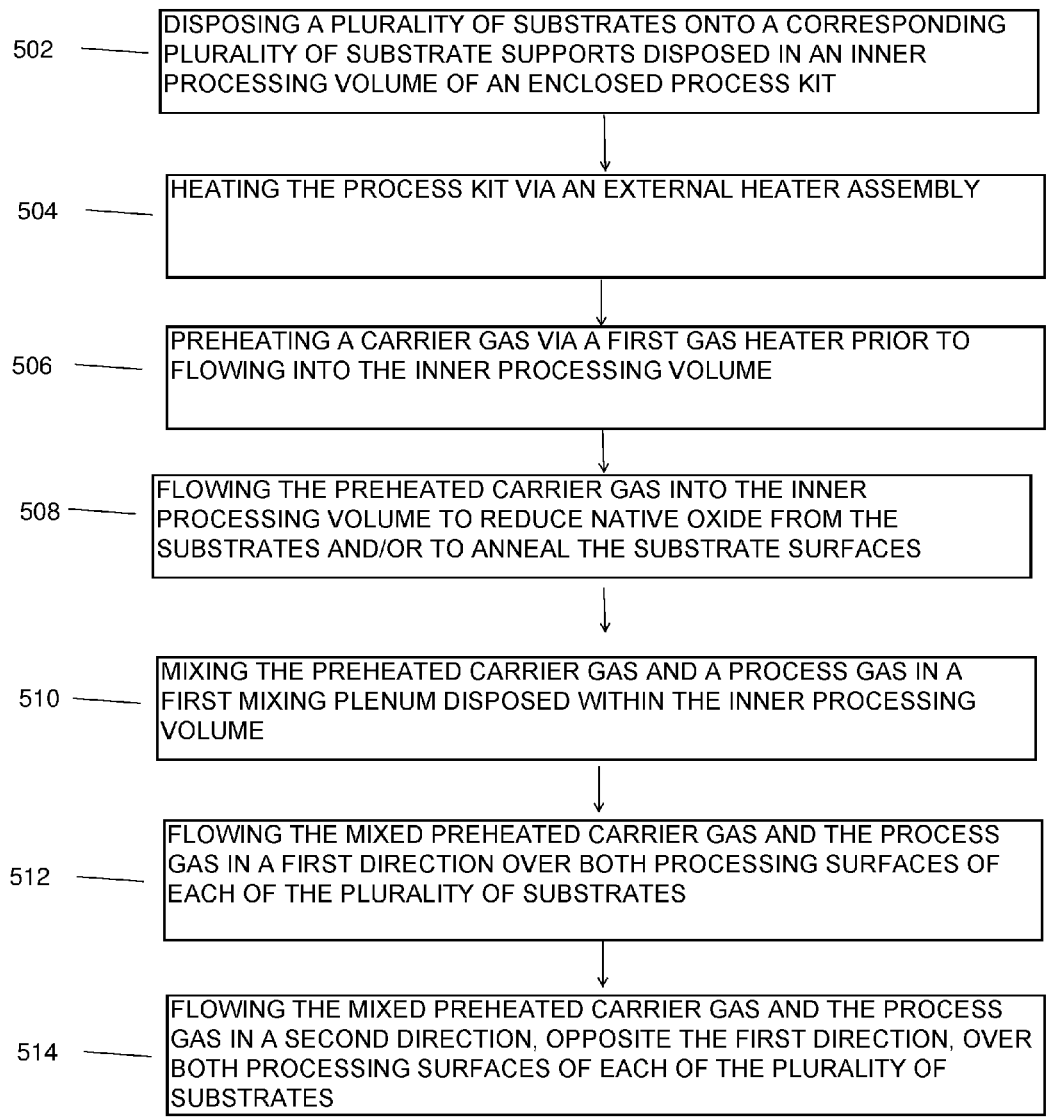
FIG. 5 depicts a flow chart for performing double-sided epitaxial deposition, in accordance with the present disclosure.

FIG. 5 depicts a flow chart describing a method 500 for performing double-sided epitaxial deposition. The method 500 begins at 502 where a plurality of substrates 106 are disposed onto a corresponding plurality of substrate supports 105. The corresponding plurality of substrate supports 105 are disposed in an inner processing volume 104 of the enclosed process kit 103 as described above. At 504, the process kit 103 is heated via an external heater assembly 102 that is adjusted to compensate for non-uniform losses to the chamber body in order to produce an isothermal vessel for multi-substrate batch processing. At 506, a carrier gas is preheated via a first gas heater 122 prior to being provided/flowed into the inner processing volume 104. In some embodiments, the preheated carrier gas (e.g., preheated hydrogen) is flowed into the inner processing volume 104 to reduce native oxide from the substrates at 508. For some methods of manufacturing kerf-less solar substrates, flowing preheated hydrogen carrier gas into the inner processing volume 104 is done to rapidly anneal electrochemically etched porous silicon substrates for five to ten minutes at 1150 degrees Celsius, or as required, for producing kerf-less solar substrates. After hydrogen annealing is complete, processing gases are mixed in a first mixing plenum 124 disposed within the inner processing volume 104 at 510. At 512, the mixed preheated carrier gas and the processing gas are flowed in a first direction over both processing surfaces of each of the plurality of substrates 106 to enable double-sided epitaxial layer growth on the plurality of substrates. In some embodiments, the mixed preheated carrier gas and the processing gas are flowed in a second direction, opposite the first direction, over both processing surfaces of each of the plurality of substrates 106 at 514. As discussed above, the isothermal heating environment created by the external heater assembly and the preheated carrier gas control the surface temperature of each processing surface of the plurality of substrates to enable double-sided epitaxial layer growth on the plurality of substrates.

Figure 6:
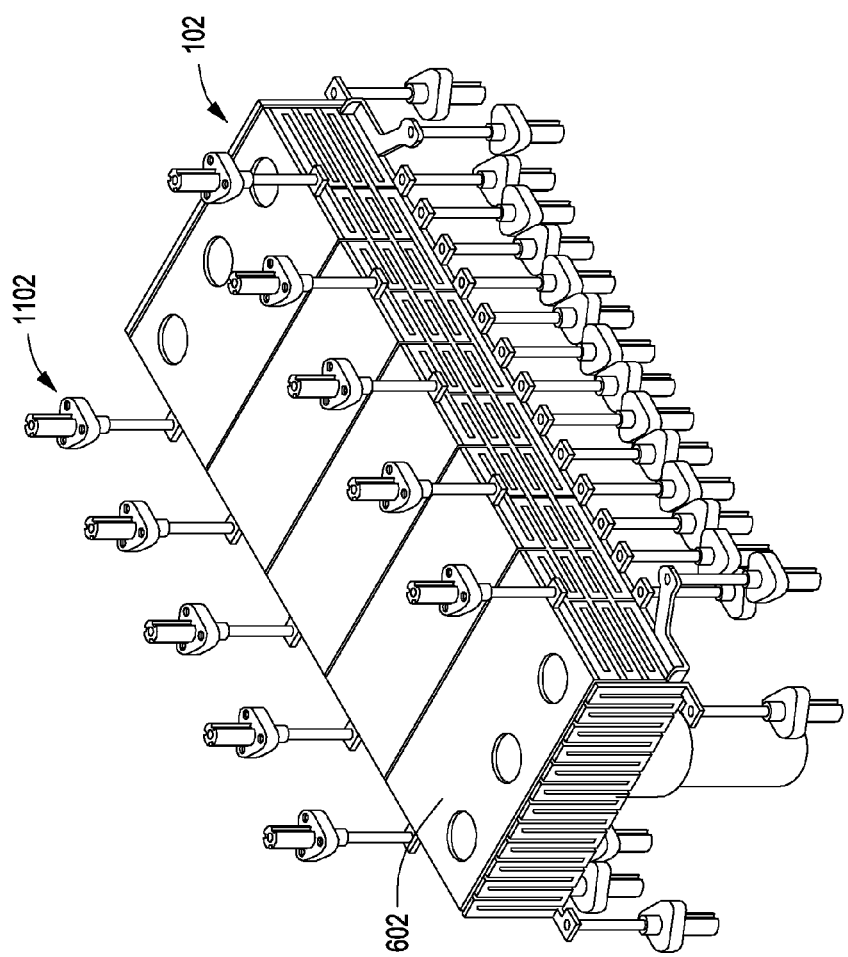
FIG. 6 depicts a multi-zone resistive heater assembly, in accordance with the present disclosure.

FIG. 6 depicts a multi-zone resistive heater assembly 102. The heater assembly 102 includes a plurality of resistive heater elements 602. The resistive heater elements 602 are coupled together to form an enclosure in which the process kit 103 is disposed and temperature controlled to be isothermal. That is, the heater assembly 102 completely encloses the process kit 103 and has zones to compensate for non-uniform heat flux from the process kit 103 to the chamber body 101. Each of the resistive heater elements 602 may be formed from graphite, and in some embodiments, may be silicon carbide coated graphite shapes. The inventive multi-zone resistive heater assembly 102 advantageously allows for multi-substrate batch substrate processing, low energy consumption, provides an isothermal processing environment, enables compact packing of loaded substrates (i.e., between 1 and 100 substrates loaded in one chamber), and can provide adjustable zone power that can be increased or decreased when switching between forward and reverse flow to compensate for thermal non-uniformities such as local cold spots in the chamber body corresponding to instrumentation ports, gas connections, doors for automation, etc. In addition, top and bottom temperature can be offset using multiple heater zones to compensate for non-uniformities due to buoyancy, as will be described below with respect to FIG. 7. FIG. 6 further depicts electrical feedthrough posts 1102 which are described below in further detail with respect to FIGS. 11A, 11B, 11C, and 12.

Figure 7:
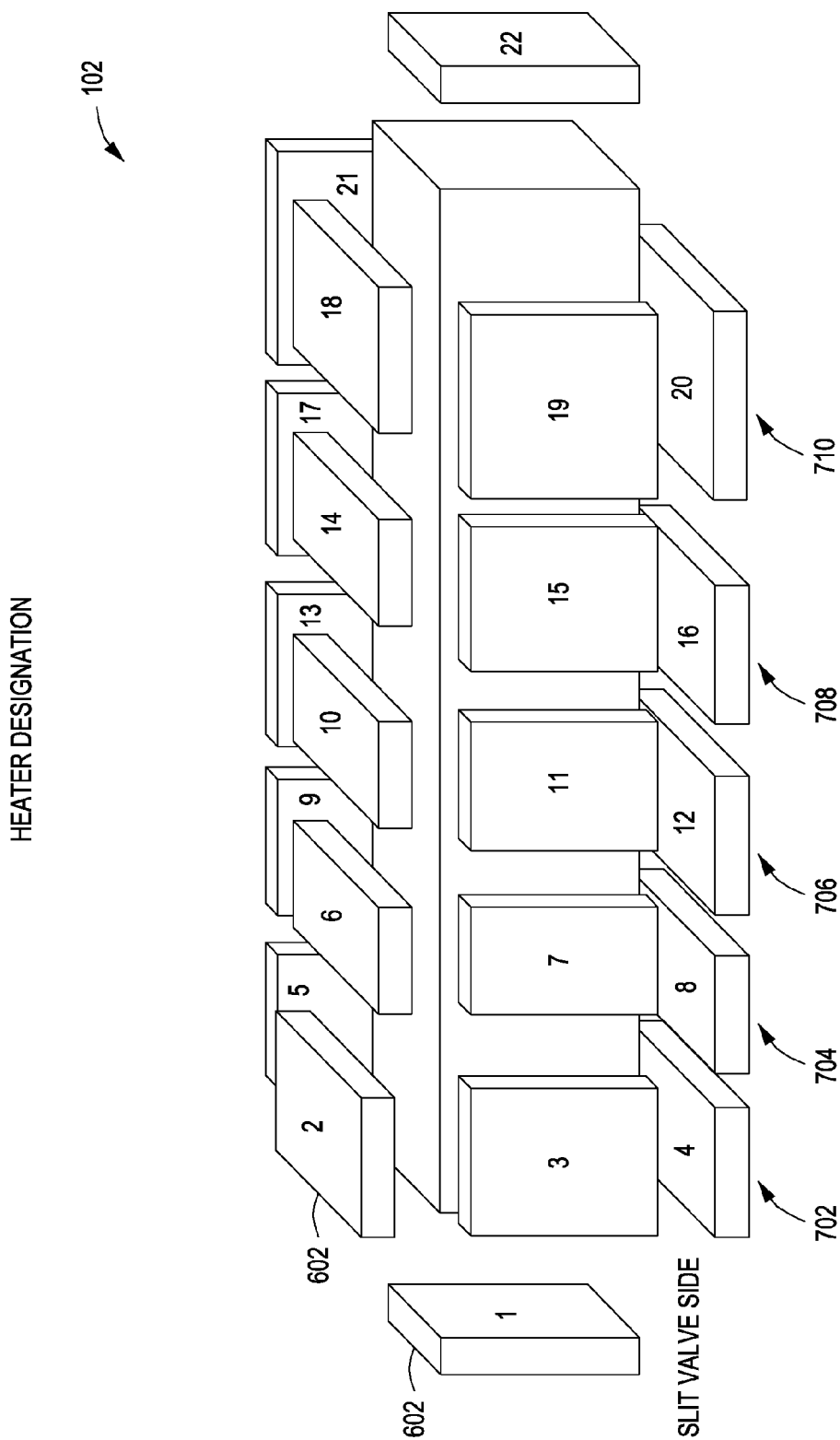
FIG. 7 depicts a breakout view of a multi-zone resistive heater assembly, in accordance with the present disclosure.
Figure 9B:
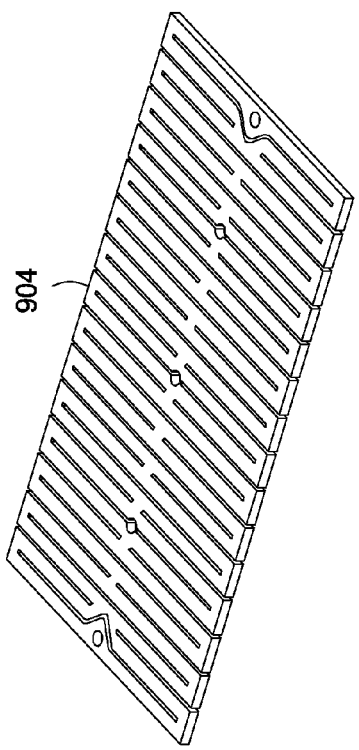
FIGS. 9A-9D depicts additional embodiments of resistive heater elements, in accordance with the present disclosure.
Figure 9D:
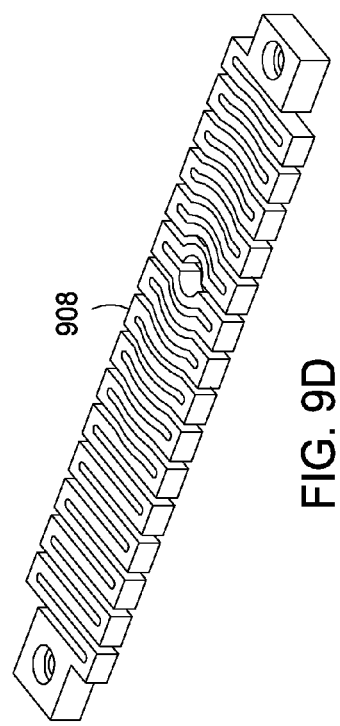
Figure 9A:
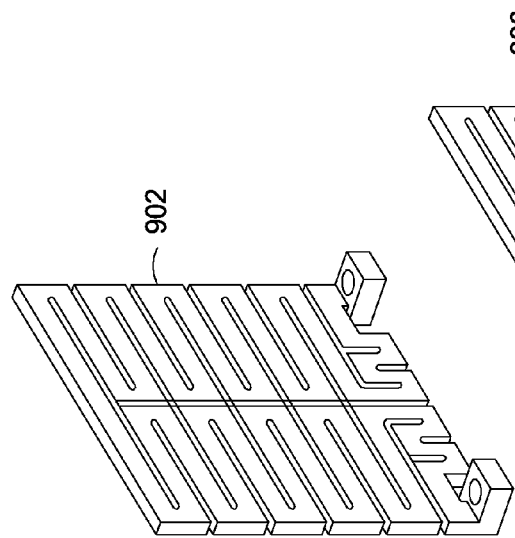
Figure 9C:
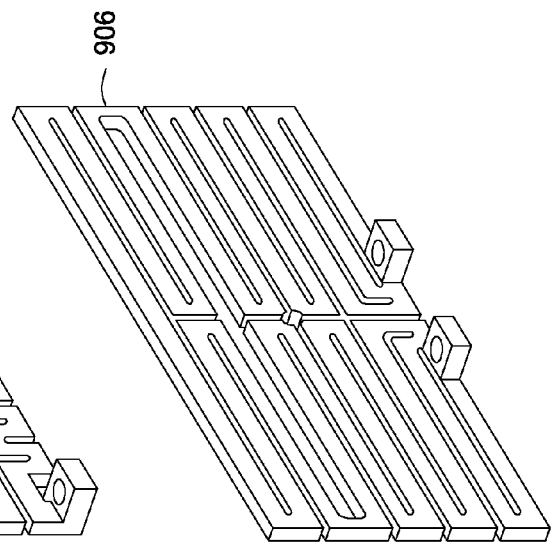

FIG. 7 depicts a schematic breakout view of the multi-zone resistive heater assembly 102. The multi-zone resistive heater assembly 102 includes a plurality of independently controllable heating zones set up along the length of the forward and reverse flow path. Specifically, FIG. 7 depicts 5 separate heating zones: a first heating zone 702 including resistive heater elements 1 through 5, a second heating zone 704 including resistive heater elements 6 through 9, a third heating zone 706 including resistive heater elements 10 through 13, a fourth heating zone 7708 including resistive heater elements 14 through 17, and a fifth heating zone 710 including resistive heater elements 18 through 22. Different heater power settings may be set per zone depending upon if the flow of processing gases is in the forward flow or reverse flow direction. Multiple heater zones provide the capability to compensate for thermal non-uniformities in the chamber that would adversely affect isothermal temperature control of the process kit 103. For example, variations in the shape and mass of the quartz chamber insulation due to serviceability and other requirements may result in asymmetric and excessive heat loss to the insulation at the start of the process that would require some heater zones radiating to thicker quartz insulation to run hotter than heater zones radiating to thinner quartz insulation. In some embodiments, bottom heaters (i.e., resistive heater elements 4, 8, 12, 16 and 20) and top heaters (i.e., resistive heater elements 2, 6, 10, 14, and 18) in the inventive multi-zone resistive heater assembly 102 may be independently temperature controlled. Bottom heater temperatures may be increased or decreased relative to top heater temperatures during hydrogen annealing or epitaxial thickening to facilitate porous silicon reorganization and epi substrate-to-substrate thickness uniformity. Different temperature offsets can be set between the top heaters and bottom heaters to drive a vertical thermal gradient substrate-to-substrate in the process kit. Side heaters (i.e., resistive heater elements 3, 5, 7, 9, 11, 13, 15, 17, 19, and 21) in the inventive multi-zone resistive heater assembly 102 may be independently temperature controlled. Side heater temperature may be increased or decreased relative to the gas heater temperature (122) to drive a horizontal thermal gradient within substrates in the process kit. The ability to control within substrate and substrate-to-substrate temperature combined with alternating flow improves multi-substrate batch yield.

FIGS. 8A and 8B depict top and side views, respectively, of an exemplary embodiment of a resistive heater element 602, in accordance with the present disclosure. Each of the resistive heater elements 602 may be formed from graphite and coated with silicon carbide (SiC). Graphite with the following properties is appropriate for high temperature epitaxial deposition above 1000 degrees Celsius:

| Property | | | | |
|---|---|---|---|---|
| Bulk density | Resistivity | Young's modulus units | CTE | Conductivity |
| g/cm3 | uOhm-m | GPa | $10^{-6}/K$ | W/mK |
| 1.4-1.9 | 10-45 | 9-12 | 5.0 | 50-150 |

The thickness of the silicon carbide coating may be about 50 microns to about 100 microns for high purity heater performance. In some embodiments, the thickness of the silicon carbide coating may be about 75 microns. A local mask around terminals 804 may be used to avoid SiC coating of the terminals. Each of the resistive heater elements 602 includes a plurality of pickets 806 through which electricity flows and induces Joule heat generation. Each of the pickets 806 are separated by gaps 808.

FIGS. 9A-9D depicts additional embodiments of exemplary form factors of resistive heater elements 902, 904, 906, and 908 and includes similar features as described with resistive heater element 602 in FIGS. 8A and 8B.

Figure 10B:
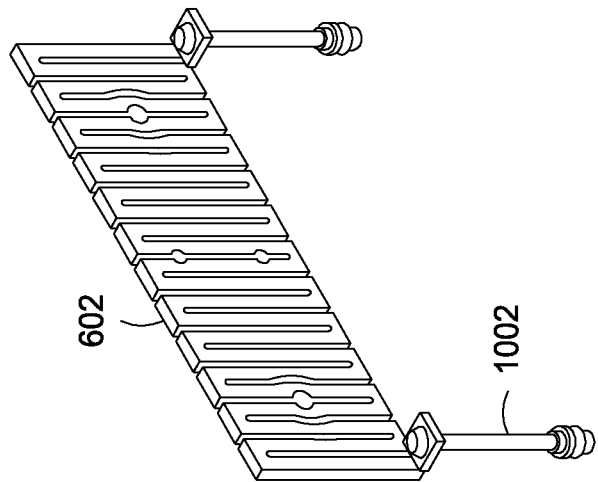
FIGS. 10A and 10B depict isometric views of a vertical resistive heater element with terminal posts, in accordance with the present disclosure.
Figure 10A:
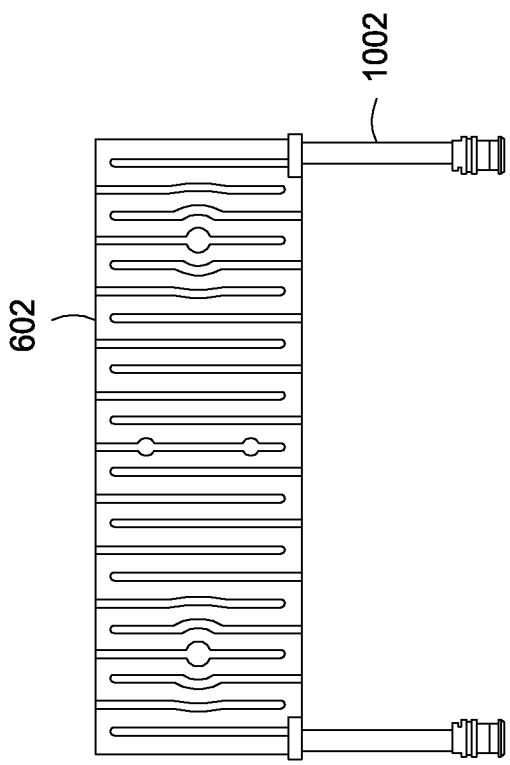
Figure 10D:
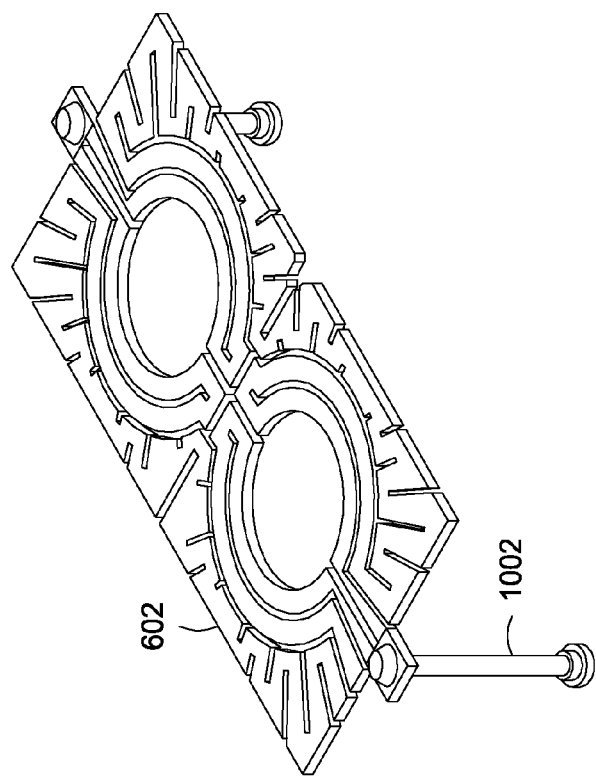
FIGS. 10C and 10D isometric views of a horizontal resistive heater element with terminal posts, in accordance with the present disclosure.
Figure 10C:
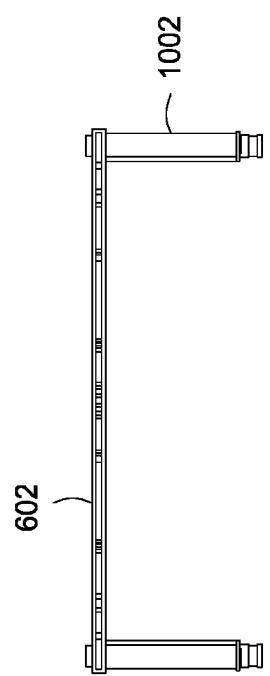

FIGS. 10A and 10B depict a front and isometric view of a vertical resistive heater element 602 with terminal posts 1002 spaced apart to minimize picket sag at operating temperature (e.g., about 1250 degrees Celsius). Specifically, graphite expands when heated. Thus, terminal posts 1002 are spaced apart and the resistive heater element 602 is installed at room temperature under tension to reduce the effect of the heater expansion at operating temperature (about 1250 degrees Celsius). FIGS. 10C and 10D depict a front and isometric view of a horizontal resistive heater element 602 with terminal posts 1002 spaced apart to compensate for thermal expansion at operating temperature (about 1250 degrees Celsius) and to minimize changes in the gap between the heater and the process kit 103. Gap variation between the vertical and horizontal heaters due to thermal expansion of the base graphite would cause unwanted thermal variation over the process kit.

FIGS. 11A-11B depict at least one embodiment of an electrical feedthrough heater post assembly 1102 that provides an electrical feedthrough to resistive heater elements 602, in accordance with the present disclosure. The inventive heater post assembly 1102 design minimizes heat losses while still meeting mechanical and electrical performance requirements. The heater post assembly 1102 is electrically and thermally coupled to the resistive heater element 602 at a terminal (i.e., terminal 804) disposed on the resistive heater element 602. In some embodiments, the heater post assembly 1102 may include a graphite heater post 1106 that fits into a hole formed in resistive heater element 602. Specific graphite grades for heater posts and plugs that are appropriate for processing above 1000 degrees Celsius should include the following properties:

| Property | | | | |
|---|---|---|---|---|
| Bulk density | Resistivity | Young's modulus | CTE | Conductivity |
| | | units | | |
| g/cm3 | uOhm-m | GPa | 10^-6/K | W/mK |
| 1.8-1.9 | 15-20 | 13 | 5-6 | 70-100 |

The heater post assembly 1102 further includes a graphite heater post expansion plug 1104 that is disposed through the hole formed in resistive heater element 602 and into a top opening of the graphite heater post 1106 to couple the graphite heater post 1106 to the resistive heater elements 602. The wall thickness of the graphite heater post 1106 is profiled to induce maximum Joule heating near the top of the post where it contacts the resistive heater element 602 and minimum Joule heating near the base of the post where it contacts the heater post socket 1114. Gradual temperature transition along the length of the graphite heater post 1106 from hottest at the interface with the resistive heater element 602 to coolest at the heater post socket 1114 allows the heater assembly to be mechanically supported in the chamber body 101 with minimum heat loss.

Figure 12A:
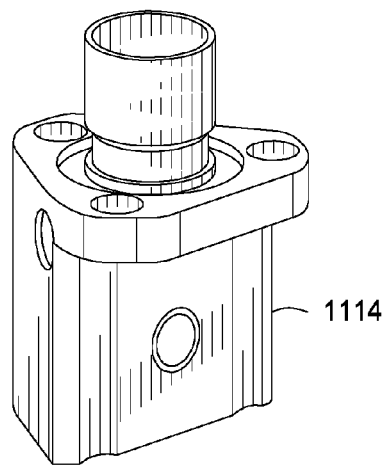
FIGS. 12A and 12B depict orthogonal and side cross-sectional views, respectively, of a heater post socket, in accordance with the present disclosure.
Figure 12B:
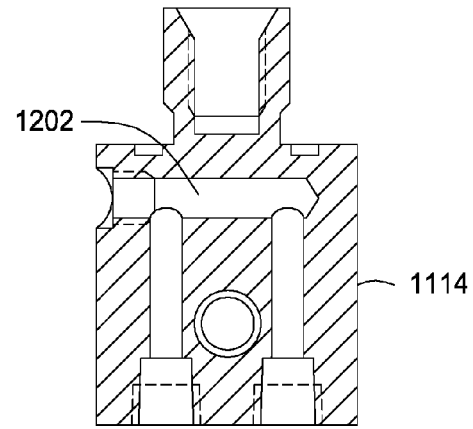

The heater post assembly 1102 further includes a ceramic tube 1108 disposed about the graphite heater post 1106. The ceramic tube 1108 can be manufactured from fused quartz tubing and used to reduce heat loss from the graphite heater post 1106. An annular dust cap 1110 is disposed about the ceramic tube 1108. In some embodiments, the dust cap may be a fused quartz or boron nitride dust cap 1110 that prevents unwanted deposits from falling into the feedthrough during operation or maintenance. The graphite heater post 1106 and ceramic tube 1108 may be disposed within a central opening of a threaded heater post socket 1114. The heater post socket 1114 maybe water cooled and is shown in further detail in FIGS. 12A and 12B. As shown in FIG. 12, the heater post socket may include fluid cooling channels/conduits 1202 to cool the body and thus cool the adjacent chamber body 101.

In some embodiments, the heater post socket 1114 may be fabricated from nickel, which has improved corrosion resistance over copper. Copper is an unsuitable feedthrough conductor for epitaxial processing due to small amounts potentially contaminating films and thereby compromising the minority carrier lifetime (MCL) and efficiency of finished solar cells. A polyetheretherketone (PEEK) electrical insulation ring 1112 may be disposed on a top surface of the heater post socket 1114. A silicone or Viton® O-Ring 1116 may be used to seal the feedthrough to the chamber body 101. PEEK screw bushings 1118 and stainless steel screws 1120 attach the PEEK insulation ring 1112 and the heater post socket 1114 to the chamber body 101.

While the foregoing is directed to embodiments of the present disclosure, other and further embodiments of the disclosure may be devised without departing from the basic scope thereof.

The invention claimed is:

1. A substrate processing system, comprising:
a chamber body;
a heater assembly disposed within the chamber body, wherein the heater assembly includes a plurality of resistive heater elements coupled together to form a heated enclosure;
a process kit disposed within the heated enclosure and having an inner processing volume that includes a plurality of substrate supports to support substrates when disposed thereon, wherein the process kit includes a first processing gas inlet to provide processing gases to the inner processing volume, a first carrier gas inlet to provide a carrier gas to the inner processing volume, and a first exhaust outlet; and
a first gas heater coupled via a first conduit to the first carrier gas inlet to preheat the carrier gas prior to entering the inner processing volume,
wherein the first processing gas inlet and the first carrier gas inlet are disposed on a first end of the process kit and configured to flow the processing gases and the carrier gas in a first direction, and
wherein the process kit further includes a second processing gas inlet to provide the processing gas to the inner processing volume, and a second carrier gas inlet to provide the carrier gas to the inner processing volume, wherein the first processing gas inlet and the second carrier gas inlet are disposed on a second end of the process kit opposite the first end, and are configured to flow the processing gases and the carrier gas in a second direction opposite the first direction.

2. The substrate processing system of claim 1, further comprising:
a second gas heater coupled via a second conduit to the first processing gas inlet to preheat the processing gases prior to entering the inner processing volume.

3. The substrate processing system of claim 1, further comprising:
a first mixing plenum disposed within the inner processing volume proximate the first processing gas inlet and the first carrier gas inlet to mix the processing gas and the preheated carrier gas.

4. The substrate processing system of claim 3, wherein the first mixing plenum includes one of a plurality of baffles or a static swirl mixer, each of which is configured to mix the processing gases and the preheated carrier gas.

5. The substrate processing system of claim 1, further comprising:
a second mixing plenum disposed within the inner processing volume proximate the second processing gas inlet and the second carrier gas inlet to mix the processing gas and the preheated carrier gas.

6. The substrate processing system of claim 1, wherein the plurality of substrate supports retain a plurality of substrates parallel to each other when disposed in the plurality of substrate supports.

7. The substrate processing system of claim 6, wherein the plurality of substrate supports retain the plurality of substrates along outer edges of the substrates while exposing both processing surfaces of the substrates to the mix of the processing gases and the preheated carrier gas.

8. The substrate processing system of claim 7, wherein the heater assembly is configured to externally heat the process kit.

9. The substrate processing system of claim 8, wherein the preheated carrier gas and the heater assembly are configured to control a temperature of the substrate to enable simultaneous double-sided processing of the substrate.

10. The substrate processing system of claim 1, wherein the heater assembly is a multi-zone resistive heater assembly that includes a plurality of independently controlled heating zones.

11. The substrate processing system of claim 1, wherein each of the plurality of resistive heater elements that form the heated enclosure are independently controllable.

12. The substrate processing system of claim 1, wherein the heater assembly completely encloses the process kit in an isothermal environment.

13. The substrate processing system of claim 1, wherein each of the resistive heater elements include a high purity silicon carbide (SiC) coating disposed on a graphite base, and wherein a thickness of the silicon coating is about 50 microns to about 100 microns.

14. The substrate processing system of claim 13, wherein the graphite base is configured as a plurality of pickets through which electricity flows to heat the graphite base, and wherein each of the pickets are separated by gaps.

15. The substrate processing system of claim 14, further comprising:
a plurality of electrical feedthrough heater posts coupled to the graphite base to provide electricity to the resistive heater elements, wherein the plurality of electrical feedthrough heater posts include:
a graphite heater post;
a ceramic tube disposed about the graphite heater post;
a heater post socket have a central opening, wherein the graphite heater post and the ceramic tube are disposed within the central opening, wherein the heater post socket comprises a base formed of nickel and one or more fluid cooling conduits formed within the base; and
a graphite heater post expansion plug disposed in a top opening of the graphite heater post and configured to couple the graphite heater post to a resistive heater plate.

* * * * *